(12) United States Patent
Hebiguchi

(10) Patent No.: US 9,229,061 B2
(45) Date of Patent: Jan. 5, 2016

(54) ELECTRICAL STORAGE DEVICE TEMPERATURE MEASURING METHOD

(71) Applicant: ALPS GREEN DEVICES CO., LTD., Tokyo (JP)

(72) Inventor: Hiroyuki Hebiguchi, Miyagi-ken (JP)

(73) Assignee: ALPS GREEN DEVICES CO., LTD., Tokyo (JP)

( * ) Notice: Subject to any disclaimer, the term of this patent is extended or adjusted under 35 U.S.C. 154(b) by 452 days.

(21) Appl. No.: 13/766,688

(22) Filed: Feb. 13, 2013

(65) Prior Publication Data

US 2013/0156072 A1    Jun. 20, 2013

Related U.S. Application Data

(63) Continuation of application No. PCT/JP2012/068927, filed on Jul. 26, 2012.

(30) Foreign Application Priority Data

Aug. 1, 2011    (JP) .................................. 2011-168518

(51) Int. Cl.

| G01K 1/12 | (2006.01) |
|---|---|
| G01K 7/00 | (2006.01) |
| G01R 31/36 | (2006.01) |
| H01M 10/48 | (2006.01) |
| G01K 13/00 | (2006.01) |
| G01K 7/42 | (2006.01) |
| H01G 11/18 | (2013.01) |
| H01G 11/84 | (2013.01) |

(52) U.S. Cl.

CPC .............. G01R 31/3606 (2013.01); G01K 7/42 (2013.01); G01K 13/00 (2013.01); H01M 10/48 (2013.01); H01M 10/486 (2013.01); H01G 11/18 (2013.01); H01G 11/84 (2013.01)

(58) Field of Classification Search

USPC ........................................ 374/182, 184, 141
See application file for complete search history.

(56) References Cited

U.S. PATENT DOCUMENTS

| 7,059,769 | B1 * | 6/2006 | Potega ........................... 374/185 |
|---|---|---|---|
| 2010/0091815 | A1 * | 4/2010 | Nakazato et al. ............. 374/152 |
| 2011/0299564 | A1 * | 12/2011 | Leutheuser et al. .......... 374/134 |
| 2012/0084032 | A1 * | 4/2012 | McHardy et al. .............. 702/63 |
| 2012/0099618 | A1 * | 4/2012 | Nishi et al. ................... 374/152 |
| 2012/0155507 | A1 * | 6/2012 | Srinivasan et al. ............. 374/45 |

FOREIGN PATENT DOCUMENTS

| JP | 6-260215 | 9/1994 |
|---|---|---|
| JP | 2003-223918 | 8/2003 |
| JP | 2005-332702 | 12/2005 |
| JP | 2006-101674 | 4/2006 |
| JP | 2010-67502 | 3/2010 |
| JP | 2011-18532 | 1/2011 |
| WO | 01/16614 | 3/2001 |

OTHER PUBLICATIONS

Search Report dated Sep. 11, 2012 from International Application No. PCT/JP2012/068927.

* cited by examiner

*Primary Examiner* — Mirellys Jagan
(74) *Attorney, Agent, or Firm* — Beyer Law Group LLP

(57) ABSTRACT

An internal impedance of an electrical storage device is measured by using a signal of a frequency which ions in the electrical storage device are difficult to follow (e.g., a frequency equal to or higher than 10 kHz), and an internal temperature of the electrical storage device is calculated from a measured value of the internal impedance.

20 Claims, 12 Drawing Sheets

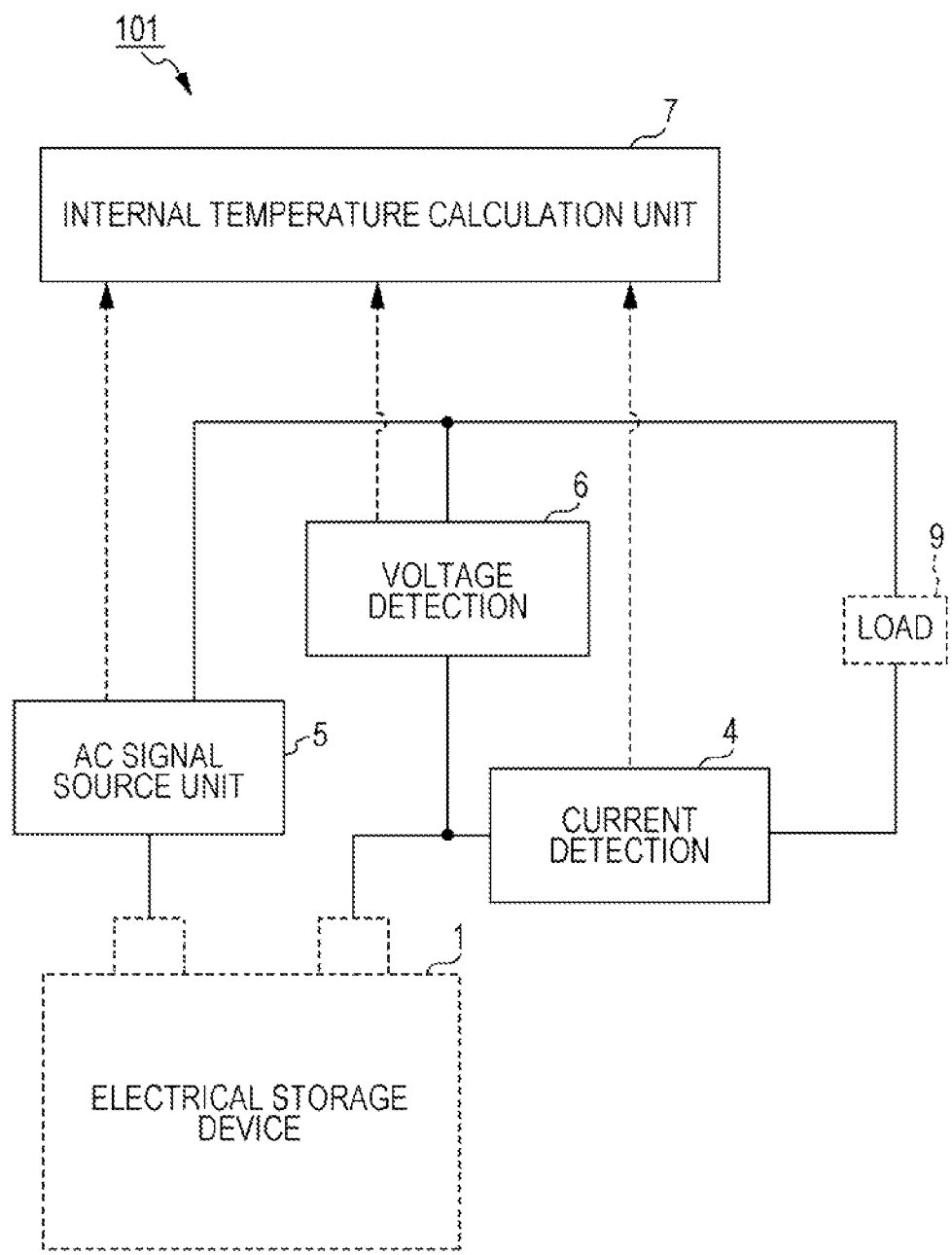

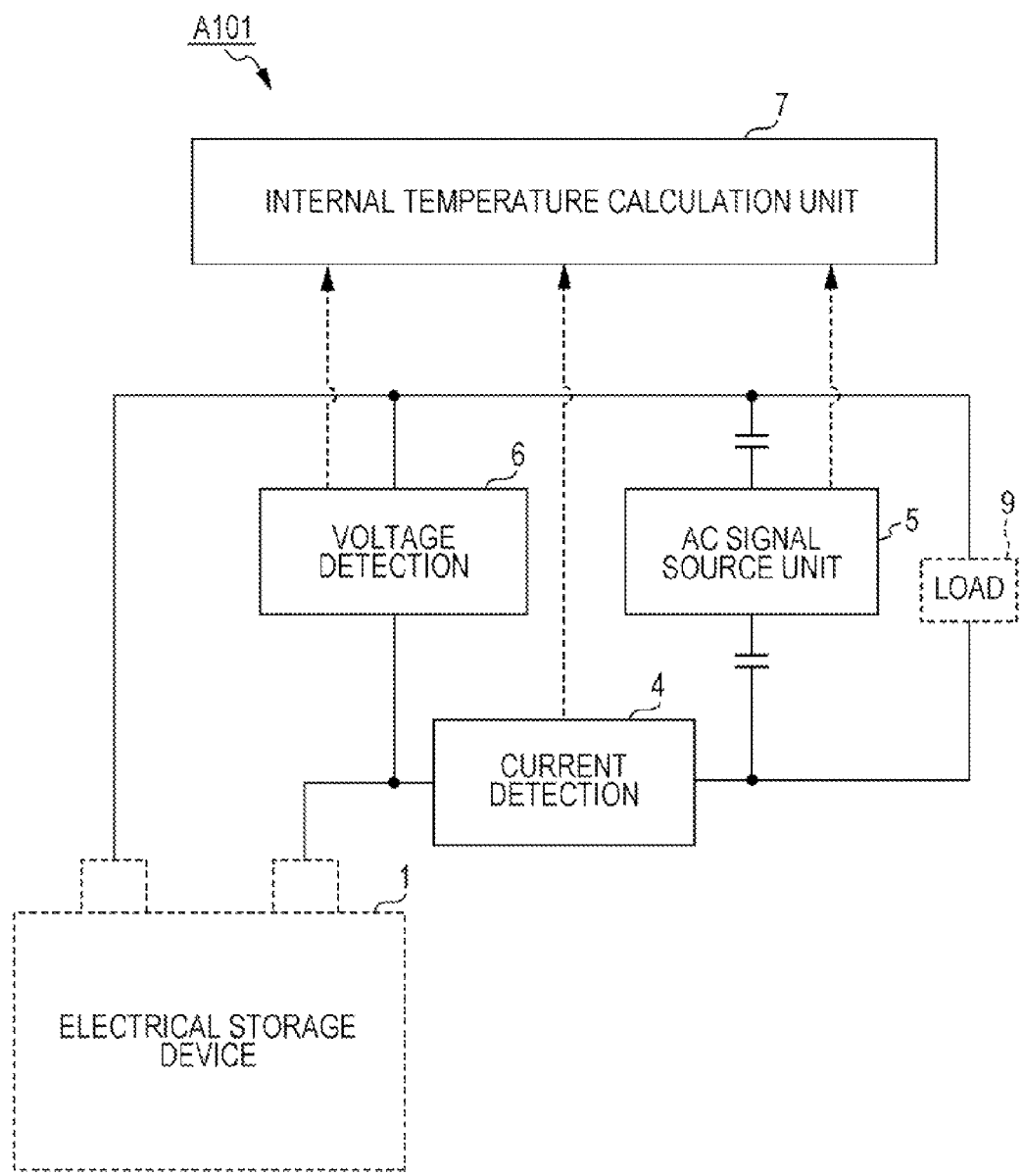

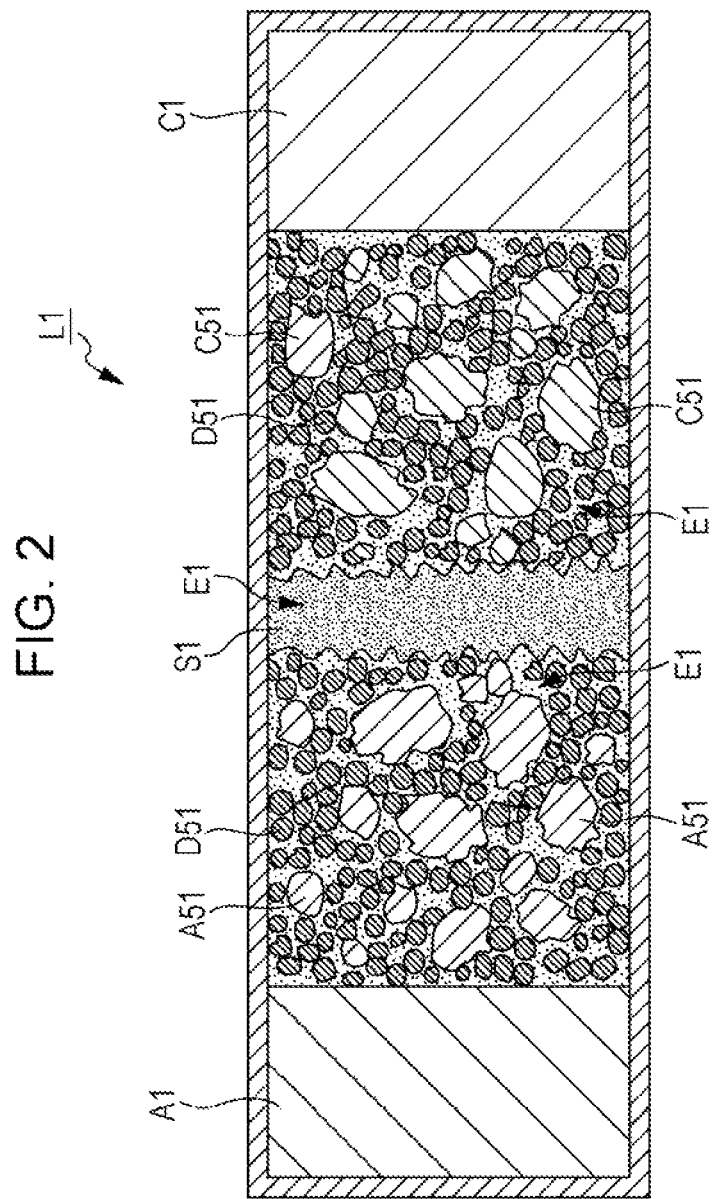

ELECTRICAL STORAGE DEVICE TEMPERATURE MEASURING METHOD

CLAIM OF PRIORITY

This application is a Continuation of International Application No. PCT/JP2012/068927 filed on Jul. 26, 2012, which claims benefit of Japanese Patent Application No. 2011-168518 filed on Aug. 1, 2011. The entire contents of each application noted above are hereby incorporated by reference.

BACKGROUND OF THE INVENTION

1. Field of the Invention

The present invention relates to a method of measuring the temperature of an electrical storage device, and particularly relates to an electrical storage device temperature measuring method for accurately measuring the internal temperature of an electrical storage device.

2. Description of the Related Art

Electrical storage devices such as a lithium ion secondary battery and an electric double layer capacitor have been used for various applications, and have been widely applied to, for example, battery packs for mobile phones, batteries for PCs, and batteries for vehicles. In such a case, it is a very important matter to detect a state of an electrical storage device such as a deterioration state (SOH; state of health) or a remaining capacity (SOC; state of charge). In particular, with regard to a vehicle, detection of the state of an electrical storage device in an energy-conservation vehicle performing an idling stop, a hybrid vehicle, an electric vehicle, or the like is deeply associated with travelling of the vehicle and thus is drawing attention as being very important.

In a generally well-known method for detecting the state of the electrical storage device, the voltage, the current, and the temperature of the electrical storage device are measured to calculate the deterioration state (SOH), the remaining capacity (SOC), or the like of the electrical storage device. In the method, the temperature of the electrical storage device is an important measurement parameter since it has a great effect on deterioration of the electrical storage device.

As the related art of a method of measuring the temperature of an electrical storage device, a method is generally known in which a temperature detection element is put on or connected to the electrical storage device to directly measure the temperature as in Japanese Unexamined Patent Application Publication No. 6-260215. Japanese Unexamined Patent Application Publication No. 6-260215 states that a Zener diode is used as the temperature detection element and connected to a plus terminal of the electrical storage device, whereby the temperature transmitted from the plus terminal of the electrical storage device can be accurately measured. However, in Japanese Unexamined Patent Application Publication No. 6-260215 (related art example 1), due to self-heating of an internal resistor of the electrical storage device or the like, a great difference may be produced between the temperature of a temperature detection point of the temperature detection element (the plus terminal of the electrical storage device in the related art example 1) and the internal temperature of the electrical storage device, and thus the temperature of the electrical storage device cannot be accurately recognized.

Meanwhile, an apparatus that detects the temperature of an electrical storage device by a temperature detection element such as a thermocouple, obtains the internal impedance of the electrical storage device, and determines a deterioration state (SOH) of the electrical storage device (e.g., see Japanese Unexamined Patent Application Publication No. 2010-67502), and an apparatus that obtains the internal impedance of an electrical storage device without using a temperature detection element and determines the internal temperature of the electrical storage device (e.g., see International Publication No. WO01/16614), have been proposed.

According to Japanese Unexamined Patent Application Publication No. 2010-67502 (related art example 2), the apparatus includes a temperature adjustment means for adjusting the temperature of the electrical storage device, an impedance calculation means for calculating the internal impedance of the electrical storage device, and a deterioration determination means for determining the deterioration state of the electrical storage device on the basis of the calculated internal impedance. In a state where the electrical storage device is adjusted to a temperature within a predetermined range by the temperature adjustment means, on the basis of the voltage of the electrical storage device, and the temperature of the electrical storage device, and a value of the internal impedance calculated when the electrical storage device is charged or discharged with an alternating current of a predetermined frequency (not lower than 10 Hz and not higher than 1 kHz), the deterioration state can be determined by referring to a map of internal impedances that are set so as to be associated with temperatures of the electrical storage device and voltages of the electrical storage device.

In addition, according to International Publication No. WO01/16614 (related art example 3), the apparatus for determining the internal temperature includes an electrical excitation circuit for providing time-varying electrical excitation to the electrical storage device, a response detection circuit for detecting a time-varying electrical response to the electrical excitation, and a calculation circuit for determining the internal temperature by using voltage and current signals derived from the inputted excitation and the response signal. Time-varying electrical excitation is provided in different frequencies (5 Hz, 70 Hz, and 1 kHz in the example), the measured impedance is assigned to an equivalent circuit, and the internal temperature of the electrical storage device is calculated from a specific element value of the equivalent circuit.

However, in the related art example 2, the internal impedance is measured in a low frequency (not lower than 10 Hz and not higher than 1 kHz in the related art example 2) which is influenced by the behavior of ions in an electrolyte of the electrical storage device. Thus, for accurately measuring the internal impedance, the measurement is conducted in a state where the electrical storage device is adjusted to a temperature within the predetermined range by the temperature adjustment means, in order to not be influenced by temperature. In this method, even when it is attempted to estimate the internal temperature of the electrical storage device on the basis of the measurement of the internal impedance, a measured value of the measured internal impedance is different depending on the deterioration state of the electrical storage device. Thus, the internal temperature of the electrical storage device cannot be accurately obtained.

In addition, in the related art example 3, it is suitable to use, for the measurement, a frequency that is less changed with respect to a remaining capacity (SOC). However, similarly to the related art example 2, the internal impedance is measured in a low frequency (5 Hz, 70 Hz, and 1 kHz in the related art example 3) which is influenced by the behavior of ions in an electrolyte of the electrical storage device. Thus, a measured value of the measured internal impedance is different depending on the deterioration state of the electrical storage device, and the internal temperature of the electrical storage device cannot be accurately obtained.

SUMMARY OF THE INVENTION

The present invention solves the above problems and provides an electrical storage device temperature measuring method for accurately measuring the internal temperature of an electrical storage device.

According to the present invention, an electrical storage device temperature measuring method includes: measuring an internal impedance of an electrical storage device by using a signal of a frequency which ions in the electrical storage device are difficult to follow; and calculating an internal temperature of the electrical storage device from a measured value of the internal impedance.

According to this configuration, since the internal temperature of the electrical storage device is calculated from the measured value obtained by measuring the internal impedance of the electrical storage device in the frequency which the ions in the electrolyte are difficult to follow, a temperature error caused by a difference in the behavior of the ions is not measured. Thus, a difference in the behavior of the ions caused by a difference in the remaining capacity or the deterioration state of the electrical storage device is not greatly reflected in the measured value. Accordingly, the internal impedance of the electrical storage device dependent only on temperature can be measured and the internal temperature of the electrical storage device can be accurately measured.

In addition, in the electrical storage device temperature measuring method according to the present invention, preferably, the electrical storage device includes a positive electrode collector, an electrolyte, a separator, and a negative electrode collector, and the frequency is a frequency in which at least one of the positive electrode collector, the electrolyte, the separator, and the negative electrode collector is measured as an electron-conductive resistance. According to this configuration, since the frequency of the signal is a frequency in which at least one of the positive electrode collector, the electrolyte, the separator, and the negative electrode collector is mainly measured as an electron-conductive resistance that is not ion-conductive, a difference in the behavior of the ions caused by a difference in the remaining capacity or the deterioration state of the electrical storage device is not greatly reflected in the measured value. Accordingly, since the electron-conductive resistance, namely, the resistance (R, the real part) in the impedance, is measured, the resistance of the electrical storage device dependent only on temperature can be measured and the internal temperature of the electrical storage device can be accurately measured.

In addition, the electrical storage device temperature measuring method according to the present invention preferably includes: measuring an internal impedance of an electrical storage device by using a signal of a frequency equal to or higher than 10 kHz; and calculating an internal temperature of the electrical storage device from a measured value of the internal impedance. According to this configuration, since the internal temperature of the electrical storage device is calculated from the measured value obtained by measuring the internal impedance of the electrical storage device in the frequency equal to or higher than 10 kHz, the ions in the electrolyte do not follow the frequency and a temperature error caused by a difference in the behavior of the ions is not measured. Thus, a difference in the behavior of the ions caused by a difference in the remaining capacity or the deterioration state of the electrical storage device is not reflected in the measured value. Accordingly, the internal impedance of the electrical storage device dependent only on temperature can be measured and the internal temperature of the electrical storage device can be accurately measured.

In addition, in the electrical storage device temperature measuring method according to the present invention, preferably, a transient response induced by a pulse provided to the electrical storage device is converted to a frequency component by using a Fourier transform to calculate the internal impedance of the frequency as the measured value. According to this configuration, since the Fourier transform of the transient response induced by the pulse provided to the electrical storage device is used to calculate, as the measured value, the internal impedance in the frequency which the ions do not follow or in the frequency equal to or higher than 10 kHz, it is not necessary to provide an alternating-current signal source for providing a signal of a high frequency to the electrical storage device, and it is also not necessary to newly provide a high-frequency signal to the electrical storage device. Accordingly, it is not necessary to prepare an alternating-current signal source for measurement, and the manufacturing cost of an electrical storage device temperature measuring apparatus using the electrical storage device temperature measuring method according to the present invention can be reduced.

In addition, in the electrical storage device temperature measuring method according to the present invention, the electrical storage device is preferably a secondary battery. According to this configuration, since the electrical storage device is a type of secondary electrical storage device that is repeatedly charged and discharged, the remaining capacity or the deterioration state of the electrical storage device is different each time of charging or discharging. In the electrical storage device temperature measuring method according to the present invention, since a difference in the behavior of the ions caused by a difference in the remaining capacity or the deterioration state of the electrical storage device is not greatly reflected in the measured value, the internal temperature of the electrical storage device can be accurately measured even in the case of using such an electrical storage device. Furthermore, when the secondary battery is applied to a large-capacity product, a great difference is produced between the internal temperature of the electrical storage device and the surface temperature of the electrical storage device by internal heating of the electrical storage device in charging or discharging with a large current. However, in such a case as well, the internal temperature of the electrical storage device can be accurately measured.

In addition, in the electrical storage device temperature measuring method according to the present invention, preferably, by a low-pass filter provided between the electrical storage device and a charging circuit connected to the electrical storage device, noise of the frequency of the signal is eliminated, the noise being generated in the charging circuit. According to this configuration, since the low-pass filter is provided between the electrical storage device and the charging circuit connected to the electrical storage device, noise of the frequency of the signal for internal temperature measurement which noise is generated in the charging circuit can be eliminated. Thus, decrease of the measurement accuracy of the internal impedance by the noise from the charging circuit can be prevented and the calculation accuracy of the temperature can be kept high.

In addition, in the electrical storage device temperature measuring method according to the present invention, preferably, by a low-pass filter provided between the electrical storage device and a load connected to the electrical storage device, noise of the frequency of the signal is eliminated, the noise being generated in the load. According to this configuration, since the low-pass filter is provided between the electrical storage device and the load connected to the electrical storage device, noise of the frequency of the signal for internal temperature measurement which noise is generated in the load can be eliminated. Thus, decrease of the measurement accuracy of the internal impedance by the noise from the load can be prevented and the calculation accuracy of the temperature can be kept high.

In addition, in the electrical storage device temperature measuring method according to the present invention, the internal impedance of the electrical storage device is preferably measured by using the signal of the frequency, the signal being generated by a switch power supply of a power converter connected to the electrical storage device. According to this configuration, since the internal impedance of the electrical storage device is measured by using the signal generated in the power converter, it is not necessary to additionally provide a signal source for generating a signal for internal temperature measurement. Thus, while the temperature measurement accuracy is kept high, the cost required for a measuring system used for the electrical storage device temperature measuring method according to the present invention can be reduced.

In addition, in the electrical storage device temperature measuring method according to the present invention, the internal impedance of the electrical storage device is preferably measured by using the signal of the frequency in which an impedance of the electrical storage device is lower than an impedance of a charging circuit connected to the electrical storage device, the impedance of the charging circuit being observed from the electrical storage device side. According to this configuration, since the internal impedance of the electrical storage device is measured by using the signal of the frequency in which the impedance of the electrical storage device is lower than the impedance of the charging circuit, influence of the charging circuit is reduced in the measurement of the internal impedance. Thus, the measurement accuracy of the internal impedance can be increased and the temperature can be calculated with high accuracy.

In addition, in the electrical storage device temperature measuring method according to the present invention, the internal impedance of the electrical storage device is preferably measured by using the signal of the frequency in which an impedance of the electrical storage device is lower than an impedance of a load connected to the electrical storage device, the impedance of the load being observed from the electrical storage device side. According to this configuration, the internal impedance of the electrical storage device is measured by using the signal of the frequency in which the impedance of the electrical storage device is lower than the impedance of the load, influence of the load is reduced in the measurement of the internal impedance. Thus, the measurement accuracy of the internal impedance can be increased and the temperature can be calculated with high accuracy.

In addition, in the electrical storage device temperature measuring method according to the present invention, preferably, by a phase compensation circuit connected to the electrical storage device, a phase of a current and a phase of a voltage by the signal of the frequency are caused to coincide with each other. According to this configuration, since the phase of the current and the phase of the voltage are caused to coincide with each other by the phase compensation circuit connected to the electrical storage device, even if the performance of a detection device is not high, the internal impedance of the electrical storage device can be measured with high accuracy. Thus, while the temperature measurement accuracy is kept high, the cost required for a measuring system used for the electrical storage device temperature measuring method according to the present invention can be reduced.

In addition, in the electrical storage device temperature measuring method according to the present invention, the electrical storage device and the phase compensation circuit preferably constitute a resonance circuit. According to this configuration, when the electrical storage device and the phase compensation circuit constitute a series resonance circuit, the imaginary part of the impedance can be 0 in the resonant frequency. Thus, it is possible to detect only the resistance component of the internal impedance of the electrical storage device by a signal of the resonant frequency. In addition, when the electrical storage device and the phase compensation circuit constitute a parallel resonance circuit, slight variation of the internal impedance of the electrical storage device can be amplified by resonance. Thus, S/N is increased and the internal impedance can be measured with high accuracy.

In addition, in the electrical storage device temperature measuring method according to the present invention, the phase compensation circuit preferably includes a capacitor. According to this configuration, since the phase compensation circuit is configured to include a capacitor, the phase of the current and the phase of the voltage can be caused to coincide with each other by the phase compensation circuit having a simple configuration.

According to the present invention, an electrical storage device temperature measuring method includes: measuring an internal impedance of an electrical storage device by using a signal of a frequency in which an inductance component of the internal impedance of the electrical storage device is more dominant than a capacitance component thereof; and calculating an internal temperature of the electrical storage device from a measured value of the internal impedance.

According to the present invention, an electrical storage device temperature measuring method includes: measuring an internal impedance of an electrical storage device by using a signal of a frequency in which a resistance component of the internal impedance of the electrical storage device is increased with increase in a temperature; and calculating an internal temperature of the electrical storage device from a measured value of the internal impedance.

BRIEF DESCRIPTION OF THE DRAWINGS

FIG. 1A is a diagram illustrating an electrical storage device temperature measuring method according to a first embodiment of the present invention and is a block diagram of a measuring system for measuring the internal temperature of an electrical storage device;

FIG. 1B is a diagram illustrating the electrical storage device temperature measuring method according to the first embodiment of the present invention and is a block diagram of another measuring system for measuring the internal temperature of the electrical storage device;

FIG. 2 is a diagram illustrating the electrical storage device temperature measuring method according to the first embodiment of the present invention and is a schematic structure diagram of a lithium ion secondary battery;

DESCRIPTION OF THE PREFERRED EMBODIMENTS

Hereinafter, embodiments of the present invention will be described in detail with reference to the accompanying drawings.

[First Embodiment]

Figure 3:
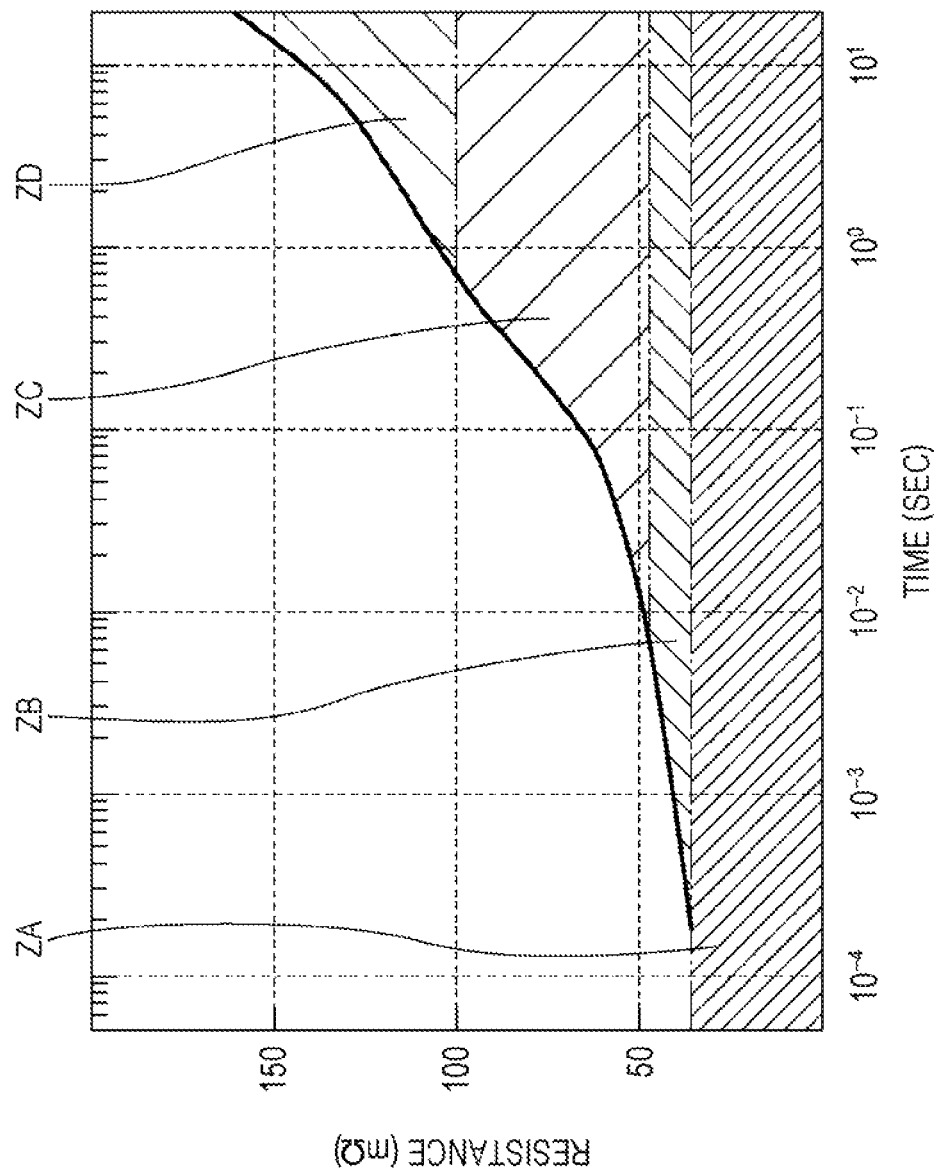
FIG. 3 is a diagram illustrating the electrical storage device temperature measuring method according to the first embodiment of the present invention and is an example of a graph representing time dependence of resistance in the electrical storage device.
Figure 4:
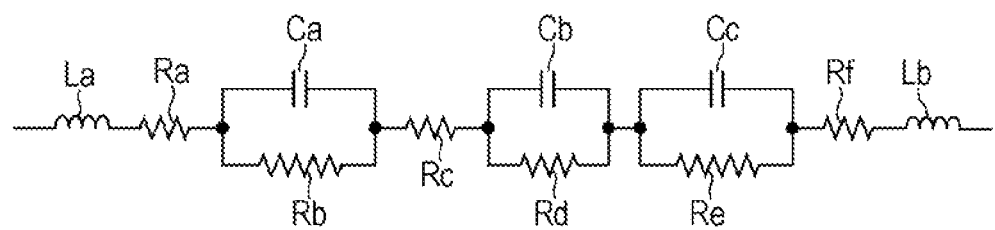
FIG. 4 is a diagram illustrating the electrical storage device temperature measuring method according to the first embodiment of the present invention and is an equivalent circuit diagram of the lithium ion secondary battery.

FIG. 1A is a diagram illustrating a temperature measuring method for an electrical storage device (an electrical storage device temperature measuring method) according to a first embodiment of the present invention and is a block diagram of a measuring system 101 for measuring the internal temperature of an electrical storage device 1. FIG. 1B is a diagram illustrating the electrical storage device temperature measuring method according to the first embodiment of the present invention and is a block diagram of a measuring system A101 for measuring the internal temperature of the electrical storage device 1. FIG. 2 is a diagram illustrating the electrical storage device temperature measuring method according to the first embodiment of the present invention and is a schematic structure diagram of a lithium ion secondary battery L1. FIG. 3 is a diagram illustrating the electrical storage device temperature measuring method according to the first embodiment of the present invention and is an example of a graph representing time dependence of resistance in the electrical storage device 1. FIG. 4 is a diagram illustrating the electrical storage device temperature measuring method according to the first embodiment of the present invention and is an equivalent circuit diagram of the lithium ion secondary battery L1.

Figure 5:
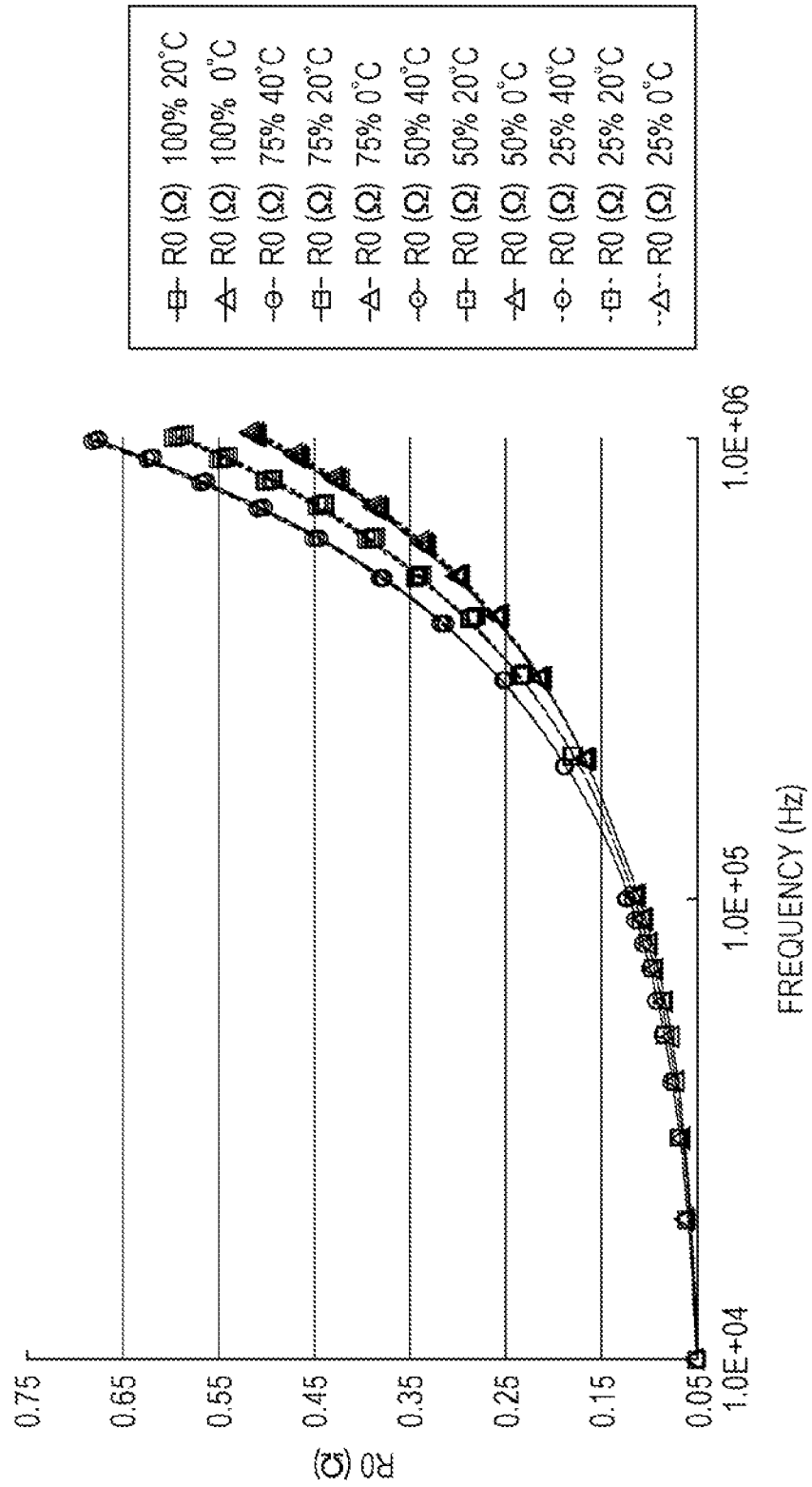
FIG. 5 is a diagram illustrating the electrical storage device temperature measuring method according to the first embodiment of the present invention and is a graph showing an example of the relationship between the frequency of a signal supplied to the electrical storage device and the real part (resistance) of an internal impedance.

FIG. 5 is a diagram illustrating the electrical storage device temperature measuring method according to the first embodiment of the present invention and is a graph showing an example of the relationship between the frequency of a signal supplied to the electrical storage device 1 and the real part (resistance component) of an internal impedance.

The electrical storage device temperature measuring method according to the first embodiment of the present invention is executed by using the measuring system 101 shown in FIG. 1A for measuring the internal temperature of the electrical storage device 1 or the measuring system A101 shown in FIG. 1B for measuring the internal temperature of the electrical storage device 1. As shown in FIG. 1A, the measuring system 101 includes an alternating-current signal source unit 5 for providing a signal of a high frequency to the electrical storage device 1, a current detection unit 4 and a voltage detection unit 6 for detecting a current and a voltage responding to the signal, and an internal temperature calculation unit 7 for calculating an internal temperature by using the inputted high-frequency signal and the detected current and voltage. In addition, as shown in FIG. 1B, the measuring system A101 has the same configuration as that of the measuring system 101, and is used, for example, in the case where the temperature of the electrical storage device is measured in a high frequency of 100 kHz or higher. In the measuring system A101, the alternating-current signal source unit 5 is connected in parallel to a load via a capacitor, and is not disposed on a current path of the electrical storage device 1. Thus, the direct-current resistance of the current path can be reduced to be small and power loss can be reduced.

The electrical storage device 1 is, for example, a rechargeable chemical battery such as a lithium ion secondary battery, but also includes a device that can store electrical energy using ions, such as an electric double layer capacitor. In general, the electrical storage device 1 mainly includes a positive electrode collector A1, a negative electrode collector C1, an electrolyte E1, and a separator S1. In addition to the above components, as shown in FIG. 2, the lithium ion secondary battery L1 includes, for example, a positive-electrode active material A51 which is a material for storing electricity on the positive electrode collector A1 side, a negative-electrode active material C51 which is a material for storing electricity on the negative electrode collector C1 side, an electrical conduction assistant D51 added to make electricity flow easily, and a binding agent which is a binder. In the case of the lithium ion secondary battery L1, aluminum (Al) is used most as the positive electrode collector A1, copper (Cu) is used most as the negative electrode collector C1, a solution composed of an organic solvent (e.g., C4H6O3) and a lithium salt (e.g., LiPF6) is used most as the electrolyte E1, lithium cobalt oxide (LiCoO2) is used most as the positive-electrode active material A51, and carbon (C) is used most as the negative-electrode active material C51. As the carbon (C) of the negative-electrode active material C51, layered black lead crystal is used and is characterized in that lithium is stored in an ionic state between the layers.

The alternating-current signal source unit 5 serves to generate a signal of a high frequency equal to or higher than about 1 kHz. The current detection unit 4 is connected in a circuit to which the electrical storage device 1 is connected and a load 9 is applied. The current detection unit 4 mainly includes a current sensor for detecting a current and a control circuit for the current sensor, and detects a current. As the current sensor, for example, a small-size current sensor using a magnetoresistive element can be used. The voltage detection unit 6 detects the voltage of the electrical storage device 1. The internal temperature calculation unit 7 measures the internal impedance of the electrical storage device 1 by using the inputted high-frequency signal and the detected current and voltage, and calculates the internal temperature of the electrical storage device 1 from the measured value of the internal impedance.

It is well-known that the measurement of the electrical storage device 1 is greatly influenced by the behavior of the ions in the electrical storage device 1 as described above. FIG. 3 is a graph showing an example of the relationship between a response time and an obtained resistance value when the resistance value of the electrical storage device 1 is measured. As shown in FIG. 3, in a range where the response time is equal to or less than 0.2 ms, the ion response does not follow, and thus the resistance value of the electrical storage device 1 is obtained as a pure resistance value of the components of the electrical storage device 1, namely, the sum of electron-conductive resistance values (a region ZA in the drawing). When the response time is equal to or greater than about 0.2 ms, a reaction resistance or the like with ions at the negative-electrode interface is observed, and the resistance value by the reaction is added to the above electron-conductive resistance value (a region ZB in the drawing). When the response time is equal to or greater than about 10 ms, a reaction resistance with ions at the positive-electrode interface is observed, and the resistance value by the reaction is added to the above electron-conductive resistance value (a region ZC in the drawing). When the response time is equal to or greater that about 1 sec, ion diffusion is performed, and thus the resistance value by the diffusion is further added (a region ZD in the drawing). In this manner, the measurement of the resistance value of the electrical storage device 1 is greatly influenced by the behavior of the ions and is also greatly associated with the response time.

FIG. 4 is an equivalent circuit diagram of the lithium ion secondary battery L1. In FIG. 4, La and Ra denote an inductance and an electrical resistance, respectively, of the positive electrode collector A1, Ca and Rb denote a capacitance and an electrical resistance, respectively, dependent on a reaction of the positive-electrode portion, Rc denotes an electrical resistance caused by the electrolyte E1, Cb and Rd denote a capacitance and an electrical resistance, respectively, caused by ions passing through the separator S1, Cc and Re denote a capacitance and an electrical resistance, respectively, dependent on a reaction of the negative-electrode portion, and Lb and Rf denote an inductance and an electrical resistance, respectively, of the negative electrode collector C1.

As shown in FIG. 4, in the internal impedance of the lithium ion secondary battery L1, Ca and Rb dependent on the reaction of the positive-electrode portion, Cb and Rd caused by the ions passing through the separator S1, and CC and Re dependent on the reaction of the negative-electrode portion are greatly influenced by the behavior of the ions. The present inventor has focused on this point and has considered that the internal impedance can be measured with high accuracy if a condition is met that the influence on Ca and Rb dependent on the reaction of the positive-electrode portion, on Cb and Rd caused by the ions passing through the separator S1, and on Cc and Re dependent on the reaction of the negative-electrode portion is sufficiently reduced.

Specifically, the gist of the present invention is to measure an internal impedance using a signal of a high frequency in which an inductance is dominant in the electrical storage device 1 (e.g., the lithium ion secondary battery L1). In such a high frequency, Ca, Cb, and Cc are substantially short-circuited, and thus an internal impedance can be measured in a state where the influence by the behavior of the ions is sufficiently reduced.

On the basis of the above technical idea, the electrical storage device temperature measuring method according to the first embodiment of the present invention is characterized in that the measurement is conducted at a response time when the influence of the ions in the electrical storage device 1 is small or not provided. In other words, the internal impedance of the electrical storage device 1 is measured using a signal of a frequency which the ions in the electrical storage device 1 are difficult to follow, and the internal temperature of the electrical storage device 1 is calculated from the measured value of the internal impedance. When the measurement is conducted using a signal of a frequency which the ions are difficult to follow, specifically, a signal of a frequency equal to or higher than about 5 kHz (corresponding to a response time of about 0.2 ms shown in FIG. 3), the response time can be shortened. Thus, the influence by the behavior of the ions can be eliminated, and the pure internal impedance of the components of the electrical storage device 1 can be measured. The internal impedance measured thus depends only on temperature, and thus the internal temperature of the electrical storage device 1 can be calculated with high accuracy from the measured value of the internal impedance. In other words, a difference in the behavior of the ions caused by a difference in the remaining capacity or the deterioration state of the electrical storage device 1 is not greatly reflected in the measured value, and thus the internal impedance of the electrical storage device 1 dependent only on temperature can be measured and the internal temperature of the electrical storage device 1 can be accurately measured. As described above, the present invention can provide a temperature measuring method for accurately measuring the internal temperature of the electrical storage device 1.

In addition, the frequency of the signal used in the electrical storage device temperature measuring method according to the first embodiment of the present invention is high to such a degree that the inductance is dominant, and at least one of the positive electrode collector A1, the electrolyte E1, the separator S1, and the negative electrode collector C1 is measured mainly as an electron-conductive resistance that is not ion-conductive. Thus, a difference in the behavior of the ions caused by a difference in the remaining capacity or the deterioration state of the electrical storage device 1 is not reflected in the measured value. Furthermore, since the electron-conductive resistance, namely, the resistance (R, the real part) in the impedance, is mainly measured, the resistance of the electrical storage device 1 dependent only on temperature can be measured and the internal temperature of the electrical storage device 1 can be more accurately measured.

Here, the ion-conductive resistance and the electron-conductive resistance can be distinguished from each other on the basis of the temperature dependence of the resistance component of the impedance. In the case of ion conduction, as the temperature is increased, the mobility of the ions is increased and the resistance component of the impedance is decreased (i.e., the temperature dependence of the resistance component of the impedance is negative). In the case of electron conduction, in particular, in the case of metal, as the temperature is increased, diffusion of electrons is increased and the resistance component of the impedance is increased (i.e., the temperature dependence of the resistance component of the impedance is positive). Therefore, when a frequency in which the resistance component of the impedance is increased with increase in the temperature (a frequency in which the temperature dependence of the resistance component of the impedance is positive) is used, the resistance of the electrical storage device 1 dependent only on temperature can be similarly measured and it is possible to more accurately measure the internal temperature of the electrical storage device 1.

In addition, since the electrical storage device 1 measured by the electrical storage device temperature measuring method according to the first embodiment of the present invention is, for example, a type of secondary battery that is repeatedly charged and discharged, and the remaining capacity or the deterioration state of the electrical storage device 1 is different each time of charging or discharging. In the electrical storage device temperature measuring method according to the first embodiment of the present invention, a difference in the behavior of the ions caused by a difference in the remaining capacity or the deterioration state of the electrical storage device 1 is not greatly reflected in the measured value. Thus, also in the case of using such an electrical storage device 1, the internal temperature of the electrical storage device 1 can be accurately measured. Furthermore, in the case where the electrical storage device 1 is applied to a large-capacity product, a great difference is produced between the internal temperature of the electrical storage device 1 and the surface temperature of the electrical storage device 1 by internal heating of the electrical storage device 1 in charging or discharging with a large current. However, in such a case as well, the electrical storage device temperature measuring method according to the first embodiment of the present invention can accurately measure the internal temperature of the electrical storage device 1.

FIG. 5 is a graph showing an example of the relationship between the frequency of a signal supplied to the electrical storage device 1 and the real part (resistance) of the internal impedance. FIG. 5 shows the relationship under a condition where the charging rate is 25%, 50%, 75%, or 100% and the temperature is 0° C., 20° C., or 40° C. From FIG. 5, it can be confirmed that in a high frequency in which the inductance is dominant, the internal impedance mainly depends on the temperature and does not depend on the charging rate. It is noted that for increasing the measurement accuracy of the impedance, the frequency of the signal used for the measurement is preferably equal to or higher than 10 kHz and more preferably equal to or higher than 100 kHz. On the other hand, in consideration of ease of measuring the impedance, the frequency of the signal is desirably equal to or lower than 1 MHz.

Due to the above, in the electrical storage device temperature measuring method according to the embodiment, since the internal temperature of the electrical storage device 1 is calculated from the measured value obtained by measuring the internal impedance of the electrical storage device 1 in a frequency which the ions are difficult to follow, a temperature error caused by a difference in the behavior of the ions is not measured. Therefore, a difference in the behavior of the ions caused by a difference in the remaining capacity or the deterioration state of the electrical storage device 1 is not greatly reflected in the measured value. Accordingly, the internal impedance of the electrical storage device 1 dependent only on temperature can be measured and the internal temperature of the electrical storage device 1 can be accurately measured.

In addition, since the frequency of the signal is a frequency in which at least one of the positive electrode collector A1, the electrolyte E1, the separator S1, and the negative electrode collector C1 is measured mainly as an electron-conductive resistance that is not ion-conductive, a difference in the behavior of the ions caused by a difference in the remaining capacity or the deterioration state of the electrical storage device 1 is not greatly reflected in the measured value. Accordingly, since the electron-conductive resistance, namely, the resistance (R, the real part) in the impedance, is measured, the resistance of the electrical storage device 1 dependent only on temperature can be measured and the internal temperature of the electrical storage device 1 can be more accurately measured.

In addition, even in the case where the electrical storage device 1 is a type of secondary battery that is repeatedly charged and discharged, a difference in the behavior of the ions caused by a difference in the remaining capacity or the deterioration state of the electrical storage device 1 is not greatly reflected in the measured value, and thus the internal temperature of the electrical storage device can be accurately measured. Furthermore, in the case where the electrical storage device 1 is applied to a large-capacity product, a great difference is produced between the internal temperature of the electrical storage device 1 and the surface temperature of the electrical storage device 1 by internal heating of the electrical storage device 1 in charging or discharging with a large current. However, in such a case as well, the internal temperature of the electrical storage device 1 can be accurately measured.

[Second Embodiment]

Figure 6:
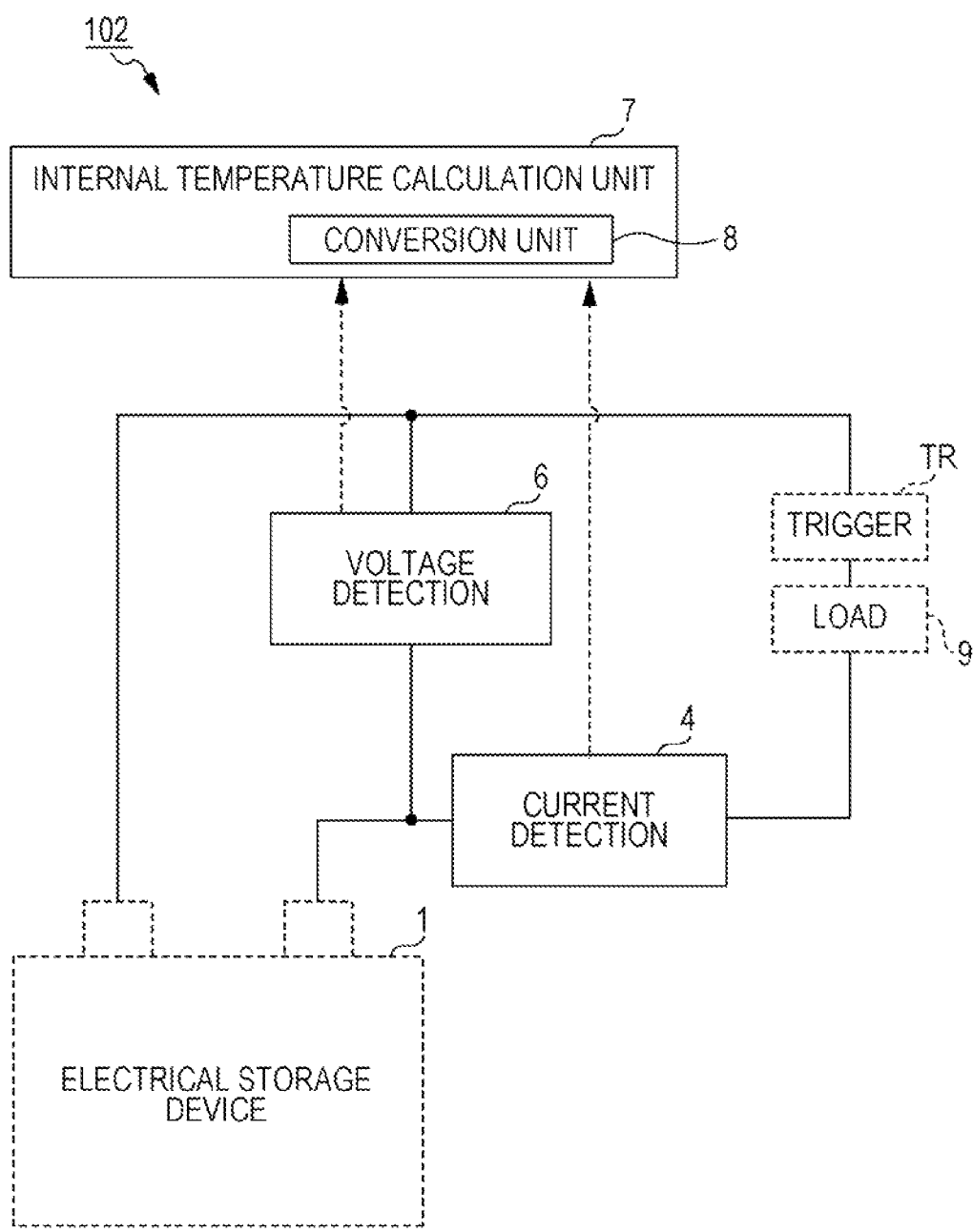
FIG. 6 is a diagram illustrating an electrical storage device temperature measuring method according to a second embodiment of the present invention and is a block diagram of a measuring system for measuring the internal temperature of the electrical storage device.

FIG. 6 is a diagram illustrating an electrical storage device temperature measuring method according to a second embodiment of the present invention and is a block diagram of a measuring system 102 for measuring the internal temperature of the electrical storage device 1. The electrical storage device temperature measuring method according to the second embodiment is different from that of the first embodiment in that a conversion unit 8 is provided which converts a pulse provided to the electrical storage device 1, to a frequency component. It is noted that the same components as those of the first embodiment are designated by the same reference characters and the detailed description thereof is omitted.

The electrical storage device temperature measuring method according to the second embodiment of the present invention is executed by using the measuring system 102 shown in FIG. 6 for measuring the internal temperature of the electrical storage device 1. As shown in FIG. 6, the measuring system 102 includes the conversion unit 8 for converting a pulse provided to the electrical storage device 1 from a trigger TR such as a switch being turned ON, to a frequency component, the current detection unit 4 and the voltage detection unit 6 for detecting a current and a voltage responding to the pulse provided to the electrical storage device 1, and the internal temperature calculation unit 7 for calculating an internal temperature by using an inputted high-frequency signal and the detected current and voltage.

The above trigger TR includes, for example, in the case of a vehicle, a switch being turned ON at start of an engine and a time of charging when a regenerative brake is applied, and a time of fast charging of the electrical storage device 1. A pulse signal generated in such a case is provided to the electrical storage device 1, and a transient response induced by the pulse can be converted into a frequency component by using a Fourier transform. A frequency which the ions in the electrical storage device 1 are difficult to follow is selected from among the frequencies included in the pulse signal, and the internal impedance of the electrical storage device 1 in this frequency is calculated as a measured value, whereby a temperature error caused by a difference in the behavior of the ions is not measured. Therefore, a difference in the behavior of the ions caused by a difference in the remaining capacity or the deterioration state of the electrical storage device 1 is not greatly reflected in the measured value, and thus the internal temperature of the electrical storage device 1 can be accurately measured.

Due to the above, in the electrical storage device temperature measuring method according to the embodiment, it is not necessary to provide an alternating-current signal source for providing a signal of a high frequency to the electrical storage device 1, and it is also not necessary to newly provide a high-frequency signal to the electrical storage device 1. Thus, it is not necessary to prepare an alternating-current signal source for measurement, and the manufacturing cost of the electrical storage device temperature measuring apparatus using the electrical storage device temperature measuring method according to the present invention can be reduced. The configuration and method according to the embodiment can be implemented as appropriate in combination with the configuration and method according to another embodiment.

[Third Embodiment]

An electrical storage device temperature measuring method according to a third embodiment is different from that of the first embodiment in that the specifications of the alternating-current signal source unit 5 in FIG. 1 are different and the alternating-current signal source unit 5 generates a signal of a frequency equal to or higher than 10 kHz. Measurement is conducted by using the signal of the frequency equal to or higher than 10 kHz. Thus, a response time is equal to or less than 0.1 ms, the ions in the electrical storage device 1 do not follow this frequency as shown in FIG. 3, and the pure resistance value of the components of the electrical storage device 1, namely, the sum of the electron-conductive resistance values, can be obtained. Therefore, the internal impedance of the electrical storage device 1 in the frequency equal to or higher than 10 kHz is calculated as a measured value, and thus a temperature error caused by a difference in the behavior of the ions is not measured.

Due to the above, in the electrical storage device temperature measuring method according to the embodiment, since the internal temperature of the electrical storage device 1 is calculated from the measured value obtained by measuring the internal impedance of the electrical storage device 1 in the frequency equal to or higher than 10 kHz, the ions in the electrical storage device 1 do not follow the frequency, and a temperature error caused by a difference in the behavior of the ions is not measured. Therefore, a difference in the behavior of the ions caused by a difference in the remaining capacity or the deterioration state of the electrical storage device 1 is not reflected in the measured value. Accordingly, the internal impedance of the electrical storage device 1 dependent only on temperature can be measured and the internal temperature of the electrical storage device 1 can be accurately measured. The configuration and method according to the embodiment can be implemented as appropriate in combination with the configuration and method according to another embodiment.

[Fourth Embodiment]

Figure 7:
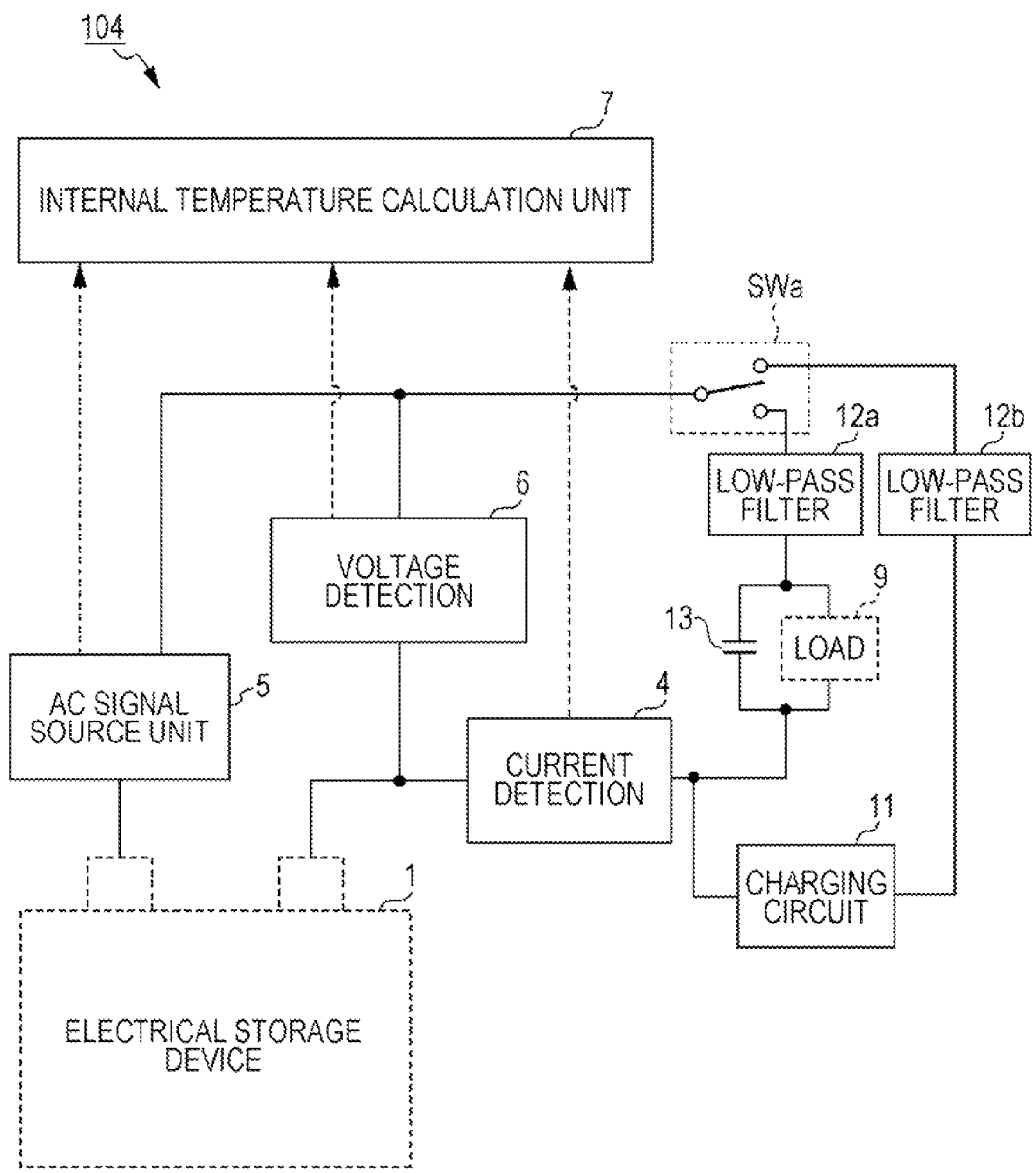
FIG. 7 is a diagram illustrating an electrical storage device temperature measuring method according to a fourth embodiment of the present invention and is a block diagram of a measuring system for measuring the internal temperature of the electrical storage device.

FIG. 7 is a diagram illustrating an electrical storage device temperature measuring method according to a fourth embodiment of the present invention and is a block diagram of a measuring system 104 for measuring the internal temperature of the electrical storage device 1. The electrical storage device temperature measuring method according to the fourth embodiment is different from that of the first embodiment in that low-pass filters 12a and 12b for eliminating noise of high frequencies generated in the load 9 and a charging circuit 11 are used. It is noted that the same components as those of the first embodiment are designated by the same reference characters and the detailed description thereof is omitted.

The electrical storage device temperature measuring method according to the fourth embodiment is executed by using the measuring system 104 shown in FIG. 7 for measuring the internal temperature of the electrical storage device 1.

As shown in FIG. 7, the measuring system 104 includes the alternating-current signal source unit 5 for providing a signal of a high frequency to the electrical storage device 1, the current detection unit 4 and the voltage detection unit 6 for detecting a current and a voltage, and the internal temperature calculation unit 7 for calculating the internal temperature of the electrical storage device 1 by using the high-frequency signal inputted from the alternating-current signal source unit 5 and the current and the voltage detected by the current detection unit 4 and the voltage detection unit 6.

The load 9 to which power is supplied and the charging circuit 11 for charging the electrical storage device 1 are connected to the electrical storage device 1 via a switch SWa. By the switch SWa, the electrical storage device 1 and the load 9 are connected to each other in discharging the electrical storage device 1, and the electrical storage device 1 and the charging circuit 11 are connected to each other in charging the electrical storage device 1. The load 9 is typically a power converter such as an inverter for converting the direct-current power of the electrical storage device 1 to alternating-current power. A capacitor 13 for suppressing a ripple current is connected in parallel to the load 9.

The low-pass filter 12a is connected in series to the load 9. The low-pass filter 12a is provided between the load 9 and the electrical storage device 1 and eliminates a high-frequency component (noise) of the signal generated in the load 9. It is noted that the low-pass filter 12a is provided on the electrical storage device 1 side of the capacitor 13 for suppressing a ripple current. Similarly, the low-pass filter 12b is connected in series to the charging circuit 11. The low-pass filter 12b is provided between the charging circuit 11 and the electrical storage device 1 and eliminates a high-frequency component (noise) of the signal generated in the charging circuit 11.

In the measuring system 104, the frequency of the signal used for measuring the internal temperature is higher than the pass bands of the low-pass filters 12a and 12b. In other words, high-frequency components (noise) of the signal generated in the load 9 and the charging circuit 11 are eliminated by the low-pass filters 12a and 12b and do not influence the detection accuracy of the current detection unit 4 and the voltage detection unit 6. Thus, decrease of the measurement accuracy of the internal temperature by the signal from the load 9 or the charging circuit 11 can be prevented.

As described above, in the electrical storage device temperature measuring method according to the embodiment, since the low-pass filter 12a is provided between the electrical storage device 1 and the load 9 connected to the electrical storage device 1 or the low-pass filter 12b is provided between the electrical storage device 1 and the charging circuit 11 connected to the electrical storage device 1, noise of the same frequency as that of the signal for internal temperature measurement can be eliminated. Thus, decrease of the measurement accuracy of the internal temperature by the noise from the load 9 or the charging circuit 11 can be prevented. The configuration and method according to the embodiment can be implemented as appropriate in combination with the configuration and method according to another embodiment.

[Fifth Embodiment]

Figure 8:
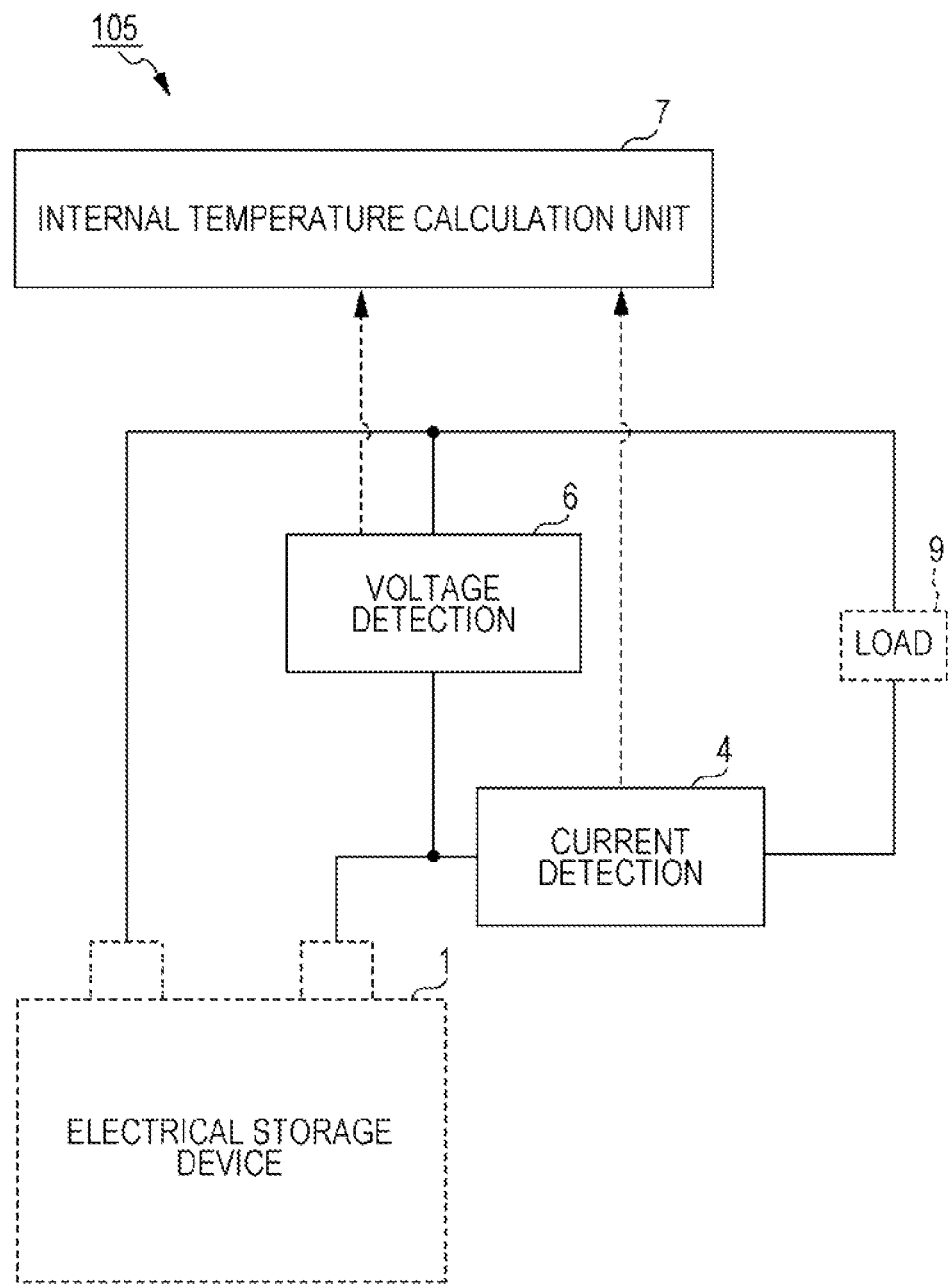
FIG. 8 is a diagram illustrating an electrical storage device temperature measuring method according to a fifth embodiment of the present invention and is a block diagram of a measuring system for measuring the internal temperature of the electrical storage device.

FIG. 8 is a diagram illustrating an electrical storage device temperature measuring method according to a fifth embodiment of the present invention and is a block diagram of a measuring system 105 for measuring the internal temperature of the electrical storage device 1. The electrical storage device temperature measuring method according to the fifth embodiment is different from that of the first embodiment in that the internal impedance of the electrical storage device 1 is measured by using a signal of a high frequency generated in the load 9. It is noted that the same components as those of the first embodiment are designated by the same reference characters and the detailed description thereof is omitted.

The electrical storage device temperature measuring method according to the fifth embodiment is executed by using the measuring system 105 shown in FIG. 8 for measuring the internal temperature of the electrical storage device 1. As shown in FIG. 8, the load 9 to which power is supplied from the electrical storage device 1 is connected to the measuring system 105. The load 9 is typically a power converter such as a DC-DC converter or an inverter for converting the direct-current power of the electrical storage device 1 to alternating-current power, and includes a switch power supply (not shown) having a fixed switch frequency. The switch power supply of the load 9 is configured to generate a signal of a high frequency (e.g., a ripple current) suitable for measuring the internal temperature of the electrical storage device 1.

In addition, the measuring system 105 includes the current detection unit 4 and the voltage detection unit 6 for detecting a current and a voltage generated with the signal from the switch power supply of the load 9, and the internal temperature calculation unit 7 for calculating the internal temperature of the electrical storage device 1 by using the signal of the high frequency inputted from the load 9 and the current and the voltage detected by the current detection unit 4 and the voltage detection unit 6.

In the electrical storage device temperature measuring method according to the embodiment, since the internal impedance of the electrical storage device 1 is measured by using the signal of the high frequency generated in the load 9, it is not necessary to provide the alternating-current signal source unit 5 as in the measuring system 101 or A101 of the first embodiment. Thus, the cost required for the measuring system can be reduced while the temperature measurement accuracy is kept high. The configuration and method according to the embodiment can be implemented as appropriate in combination with the configuration and method according to another embodiment.

[Sixth Embodiment]

Figure 9:
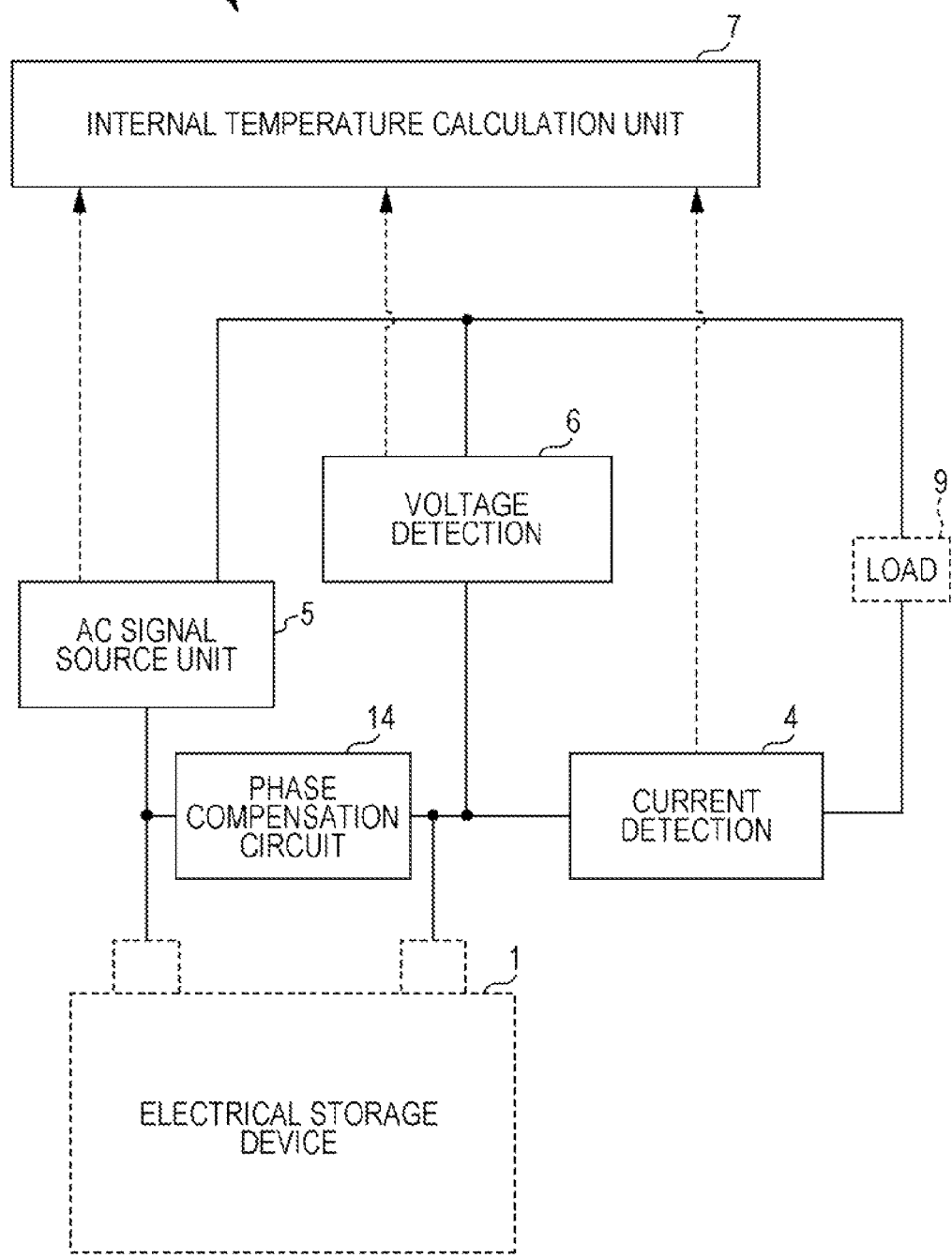
FIG. 9 is a diagram illustrating an electrical storage device temperature measuring method according to a sixth embodiment of the present invention and is a block diagram of a measuring system for measuring the internal temperature of the electrical storage device.

FIG. 9 is a diagram illustrating an electrical storage device temperature measuring method according to a sixth embodiment of the present invention and is a block diagram of a measuring system 106 for measuring the internal temperature of the electrical storage device 1. The electrical storage device temperature measuring method according to the sixth embodiment is different from that of the first embodiment in that a phase compensation circuit 14 for causing the phase of a current and the phase of a voltage to coincide with each other is used. It is noted that the same components as those of the first embodiment are designated by the same reference characters and the detailed description thereof is omitted.

The electrical storage device temperature measuring method according to the sixth embodiment is executed by using the measuring system 106 shown in FIG. 9 for measuring the internal temperature of the electrical storage device 1. As shown in FIG. 9, the measuring system 106 includes the alternating-current signal source unit 5 for providing a signal of a high frequency to the electrical storage device 1, the current detection unit 4 and the voltage detection unit 6 for detecting a current and a voltage generated by the signal from the alternating-current signal source unit 5, and the internal temperature calculation unit 7 for calculating the internal temperature of the electrical storage device 1 by using the inputted high-frequency signal and the detected current and voltage.

The phase compensation circuit 14 for causing the phases of the current and the voltage generated by the signal of the high frequency from the alternating-current signal source unit 5 to coincide with each other is connected to the electrical storage device 1. In general, for obtaining the internal impedance of the electrical storage device 1, the current detection unit 4 and the voltage detection unit 6 are required to have high time resolution in order to measure the phase difference between the current and the voltage. On the other hand, in the measuring system 106 of the embodiment, since the phases of the current and the voltage are caused to coincide with each other by the phase compensation circuit 14, even if the time resolution of the current detection unit 4 and the voltage detection unit 6 is not high, the resistance component (real part) of the internal impedance of the electrical storage device 1 can be measured with high accuracy. In addition, since it is not necessary to calculate the phase difference between the current and the voltage, the internal impedance of the electrical storage device 1 can be measured in real time.

The phase compensation circuit 14 is preferably provided such that the electrical storage device 1 and the phase compensation circuit 14 constitute a series resonance circuit. In this case, the imaginary part of the impedance can be 0 in the resonant frequency. Thus, when a signal of the resonant frequency is used, only the resistance component of the internal impedance of the electrical storage device 1 can be detected. Alternatively, the phase compensation circuit 14 is preferably provided such that the electrical storage device 1 and the phase compensation circuit 14 constitute a parallel resonance circuit. In this case, slight variation of the internal impedance of the electrical storage device 1 can be amplified by resonance. Thus, S/N is increased and the internal impedance can be measured with high accuracy. In addition, in the frequency used in the electrical storage device temperature measuring method according to the embodiment, the inductance component is dominant in the impedance of the electrical storage device 1. Thus, the phase compensation circuit 14 is preferably configured to include a capacitor. In this case, the phases of the current and the voltage can be caused to coincide with each other by the phase compensation circuit 14 having a simple configuration.

Figure 10:
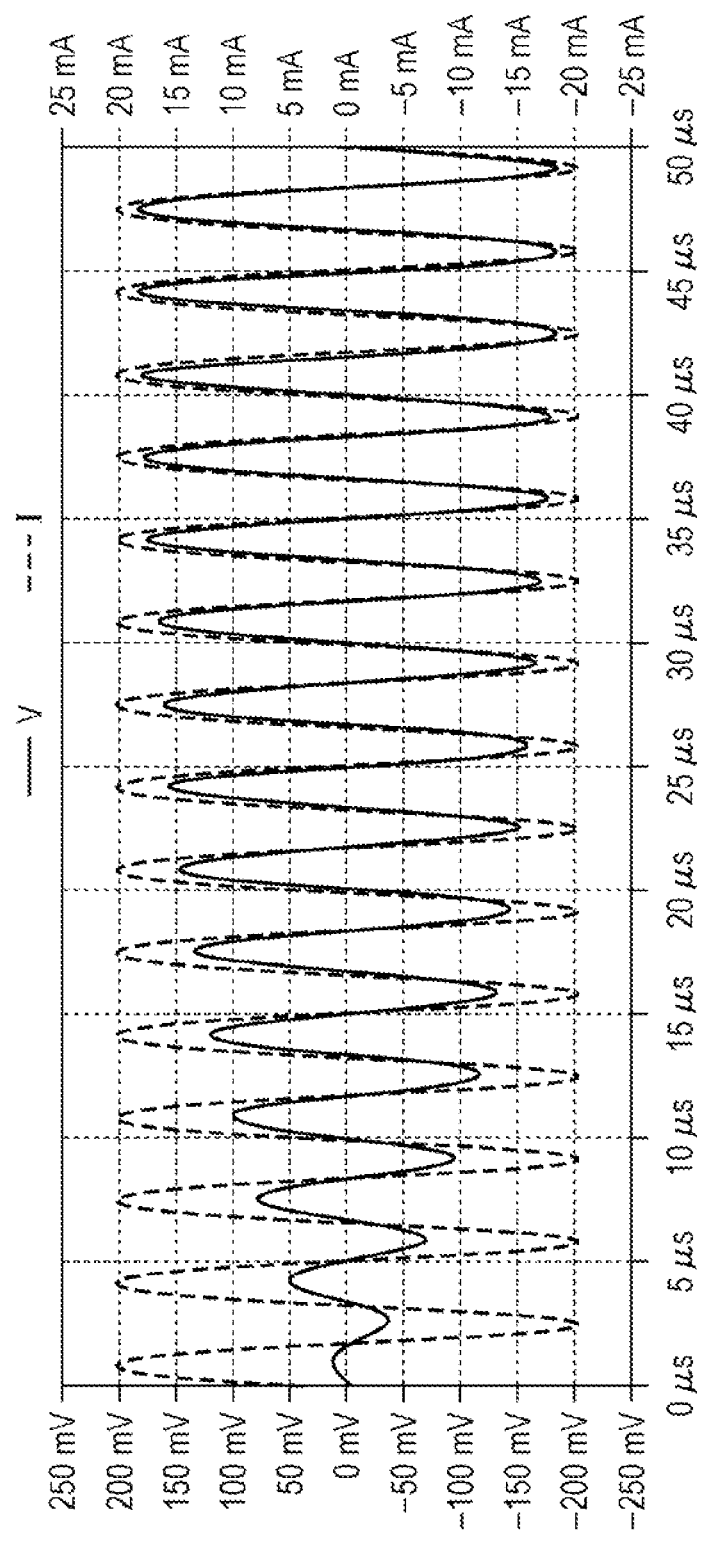
FIG. 10 is a diagram illustrating the electrical storage device temperature measuring method according to the sixth embodiment of the present invention and is a graph showing a state where a current and a voltage are in phase.

FIG. 10 is a graph showing a state where the phase of a current and the phase of a voltage are caused to coincide with each other by the resonance circuit composed of the electrical storage device 1 and the phase compensation circuit 14. FIG. 10 shows a case where the alternating-current signal source unit 5 is used as a constant current source and an alternating current having a frequency of 300 kHz and having maximum and minimum of ±20 mA is generated. As shown in FIG. 10, it is recognized that the phase of the current (a broken line) and the phase of the voltage (a solid line) are caused to coincide with each other by using the phase compensation circuit 14.

As described above, in the electrical storage device temperature measuring method according to the embodiment, since the phase of the current and the phase of the voltage are caused to coincide with each other by the phase compensation circuit 14 connected to the electrical storage device 1, even if the performance of the detection device is not high, the internal impedance of the electrical storage device 1 can be measured with high accuracy. Thus, the cost required for the measuring system can be reduced while the temperature measurement accuracy is kept high. The configuration and method according to the embodiment can be implemented as appropriate in combination with the configuration and method according to another embodiment.

[Seventh Embodiment]

In an electrical storage device temperature measuring method according to a seventh embodiment, for example, in the measuring system 104 shown in FIG. 7, the internal impedance of the electrical storage device 1 is measured under a condition where the impedance of the electrical storage device 1 is lower than the impedance of the charging circuit 11 observed from the electrical storage device 1 side. In addition, for example, in the measuring system 105 shown in FIG. 8, the internal impedance of the electrical storage device 1 is measured under a condition where the impedance of the electrical storage device 1 is lower than the impedance of the load 9 observed from the electrical storage device 1 side.

Specifically, where the impedance of the electrical storage device 1 is Z1, the impedance of the load 9 observed from the electrical storage device 1 side is Z2, and the impedance of the charging circuit 11 observed from the electrical storage device 1 side is Z3, Z1<Z2 or Z1<Z3 is satisfied in the frequency used for the measurement. In this case, influence of the components other than the electrical storage device 1 is reduced, and thus the measurement accuracy of the internal impedance can be increased. As a result, high temperature measurement accuracy can be achieved. The configuration and method according to the embodiment can be implemented as appropriate in combination with the configuration and method according to another embodiment.

It is noted that the present invention is not limited to the embodiments described above, for example, the embodiments can be modified as follows to implement the present invention, and these embodiments also belong to the technical scope of the present invention.

<Modification 1>

Figure 11:
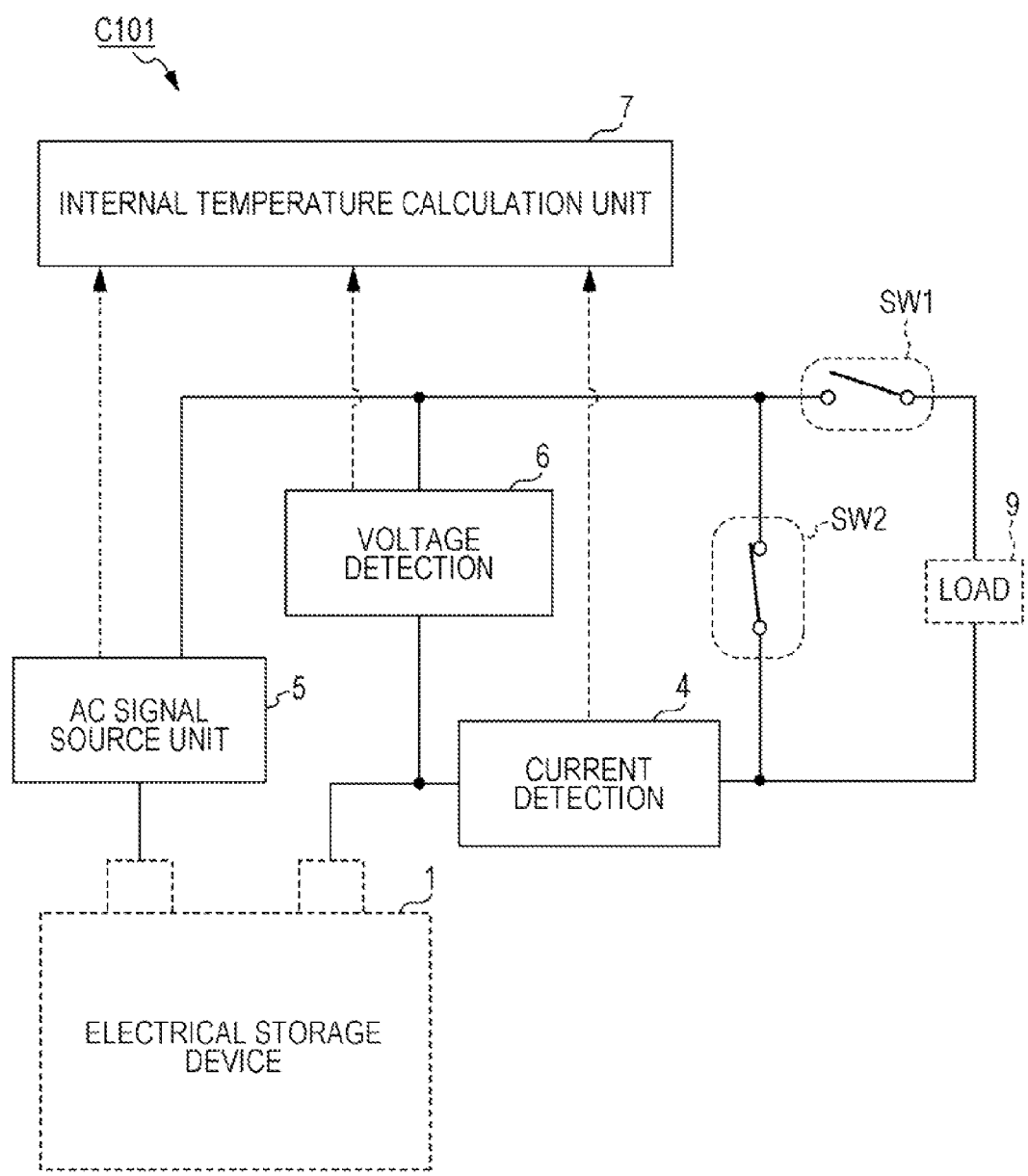
FIG. 11 is a diagram illustrating Modification 1 of the electrical storage device temperature measuring method according to the first embodiment of the present invention and is a block diagram of a measuring system for measuring the internal temperature of the electrical storage device.

FIG. 11 is a diagram illustrating Modification 1 of the electrical storage device temperature measuring method according to the first embodiment of the present invention and is a block diagram of a measuring system C101 for measuring the internal temperature of the electrical storage device 1. The measuring system C101 may be such that as shown in FIG. 11, a switch SW1 and a switch SW2 are provided in the measurement chain of the measuring system 101 according to the first embodiment described above. According to this, in the case where the measurement is influenced by the load 9, the measurement is conducted when the switch SW1 is opened and the switch SW2 is closed at a timing when the load 9 does not have to be driven. By so doing, a higher-accuracy measured value can be obtained.

The present invention is not limited to the embodiments described above, and modifications can be made as appropriate without departing from the scope of the purpose of the present invention.

The electrical storage device temperature measuring method according to the present invention is useful when obtaining the deterioration state (SOH) or the remaining capacity (SOC) of an electrical storage device.

What is claimed is:

1. A method for measuring an electrical storage device temperature, the method comprising:
   measuring an internal impedance of an electrical storage device using a signal having such a frequency that ions in the electrical storage device are substantially unable to respond thereto; and
   calculating an internal temperature of the electrical storage device from a measured value of the internal impedance,
   wherein the measuring the internal impedance includes:
   providing a pulse signal to the electrical storage device and inducing a transient response therein; and
   converting the transient response into a frequency component by a Fourier transform so as to obtain the measured value.

2. The method according to claim 1, wherein the electrical storage device includes a positive electrode collector, an electrolyte, a separator, and a negative electrode collector, and
   wherein the frequency of the signal allows that an electron conductive resistance of at least one of the positive electrode collector, the electrolyte, the separator, and the negative electrode collector is measured as the internal impedance by the signal.

3. The method according to claim 1, wherein the frequency of the signal is equal to or higher than 10 kHz.

4. The method according to claim 1, wherein the electrical storage device is a secondary battery.

5. The method according to claim 1, further comprising:
   removing a noise having the frequency of the signal by a low-pass filter provided between the electrical storage device and a charging circuit connected to the electrical storage device, the noise being generated in the charging circuit.

6. The method according to claim 1, further comprising:
   removing a noise having the frequency of the signal by a low-pass filter provided between the electrical storage device and a load connected to the electrical storage device, the noise being generated in the load.

7. The method according to claim 1, wherein the signal is generated by a switch power supply of a power converter connected to the electrical storage device.

8. The method according to claim 1, wherein the frequency of the signal is also such a frequency that a resistance component of the internal impedance of the electrical storage device increases as a temperature thereof increases.

9. The method according to claim 1, further comprising:
   aligning, by a phase compensation circuit connected to the electrical storage device, a phase of a detected current signal and a phase of a detected voltage signal obtained from the electrical storage device in response to an application of the signal having the frequency.

10. The method according to claim 9, wherein the electrical storage device and the phase compensation circuit form a resonance circuit.

11. The method according to claim 9, wherein the phase compensation circuit includes a capacitor.

12. A method for measuring an electrical storage device temperature, the method comprising:
   measuring an internal impedance of an electrical storage device using a signal having such a frequency that ions in the electrical storage device are substantially unable to respond thereto; and
   calculating an internal temperature of the electrical storage device from a measured value of the internal impedance,
   wherein the measuring the internal impedance is performed under a condition where an impedance of the electrical storage device is lower than an impedance of a charging circuit connected to the electrical storage device, when the impedance of the charging circuit is seen from the electrical storage device side.

13. The method according to claim 12, wherein the measuring the internal impedance includes:
   providing a pulse signal to the electrical storage device and inducing a transient response therein; and
   converting the transient response into a frequency component by a Fourier transform so as to obtain the measured value.

14. The method according to claim 12, further comprising:
aligning, by a phase compensation circuit connected to the electrical storage device, a phase of a detected current signal and a phase of a detected voltage signal obtained from the electrical storage device in response to an application of the signal having the frequency.

15. A method for measuring an electrical storage device temperature, the method comprising:
measuring an internal impedance of an electrical storage device using a signal having such a frequency that ions in the electrical storage device are substantially unable to respond thereto; and
calculating an internal temperature of the electrical storage device from a measured value of the internal impedance,
wherein the measuring the internal impedance is performed under a condition where an impedance of the electrical storage device is lower than an impedance of a load connected to the electrical storage device, when the impedance of the load is seen from the electrical storage device side.

16. The method according to claim 15, wherein the measuring the internal impedance includes:
providing a pulse signal to the electrical storage device and inducing a transient response therein; and
converting the transient response into a frequency component by a Fourier transform so as to obtain the measured value.

17. The method according to claim 15, further comprising:
aligning, by a phase compensation circuit connected to the electrical storage device, a phase of a detected current signal and a phase of a detected voltage signal obtained from the electrical storage device in response to an application of the signal having the frequency.

18. A method for measuring an electrical storage device temperature, the method comprising:
measuring an internal impedance of an electrical storage device using a signal having such a frequency that an inductance component of the internal impedance of the electrical storage device is more dominant than a capacitance component thereof; and
calculating an internal temperature of the electrical storage device from a measured value of the internal impedance.

19. The method according to claim 18, wherein the measuring the internal impedance includes:
providing a pulse signal to the electrical storage device and inducing a transient response therein; and
converting the transient response into a frequency component by a Fourier transform so as to obtain the measured value.

20. The method according to claim 18, further comprising:
aligning, by a phase compensation circuit connected to the electrical storage device, a phase of a detected current signal and a phase of a detected voltage signal obtained from the electrical storage device in response to an application of the signal having the frequency.

\* \* \* \* \*